United States Patent [19]

Gebara

[11] Patent Number: 5,389,897
[45] Date of Patent: Feb. 14, 1995

[54] METHOD OF AND APPARATUS FOR LIMITING THE FREE RUNNING FREQUENCY IN MULTIPLYING PHASE-LOCKED LOOP CIRCUITS

[75] Inventor: Ghassan R. Gebara, Spring, Tex.

[73] Assignee: Compaq Computer Corporation, Houston, Tex.

[21] Appl. No.: 34,289

[22] Filed: Mar. 22, 1993

[51] Int. Cl.$^6$ ............................................. H03L 7/00
[52] U.S. Cl. ..................................................... 331/1
[58] Field of Search ........................ 331/1, 15, 10, 17

[56] References Cited

U.S. PATENT DOCUMENTS

| | | | |
|---|---|---|---|
| 5,124,670 | 6/1992 | Lawton | 331/10 |
| 5,124,671 | 6/1992 | Srivastava | 331/10 |
| 5,138,281 | 8/1992 | Boudewijns | 331/1 A |
| 5,184,091 | 2/1993 | Srivastava | 331/10 |
| 5,208,555 | 5/1993 | Graham et al. | 331/1 A |
| 5,257,294 | 10/1993 | Pinto et al. | 331/1 A |
| 5,294,894 | 3/1994 | Gebara | 331/1 A |

Primary Examiner—Raymond A. Nelli
Attorney, Agent, or Firm—Pravel, Hewitt, Kimball & Krieger

[57] ABSTRACT

A method of and apparatus for limiting the output voltage of a voltage controlled oscillator in a phase-locked loop circuit to a frequency below the maximum input frequency of a divider stage in the phase-locked loop circuit. That frequency is limited by limiting the input voltage of the voltage control oscillator to a voltage less than the maximum allowable input voltage. Thus, the free running frequency of the voltage control oscillator is reduced proportionately to the amount the voltage is limited below its maximum voltage. The voltage is limited by connecting a Zener diode between ground and the output of a low pass filter that provides a voltage to the voltage controlled oscillator.

6 Claims, 5 Drawing Sheets

METHOD OF AND APPARATUS FOR LIMITING THE FREE RUNNING FREQUENCY IN MULTIPLYING PHASE-LOCKED LOOP CIRCUITS

BACKGROUND OF THE INVENTION

1. Field of the Invention

The invention relates to computer clocking systems, and more particularly, to methods of and devices for preventing the free running frequency in phase-locked loops from exceeding the allowable input frequency for flip-flops in the phase-locked loops.

2. Description of the Related Art

In efforts to realize greater computing power, microprocessor developers have continuously pushed the clock speeds ever higher. As few as ten years ago, microprocessor clock frequencies of 16 MHz were rare. Today, one sees microprocessors running at frequencies of 66 MHz and even higher.

With these higher clock frequencies have come concurrent problems. Distribution of a 66 MHz clock to the various components of a digital computer system can present difficulties associated with electromagnetic interference (EMI), clock skew, and reflections of the higher harmonics of the system clock signal. Transmission of high frequency clock signals across connectors to companion boards exacerbates these problems.

Developers have sought creative solutions to these problems. One approach has been to rely on a lower frequency system clock, and then generate, on the microprocessor or peripheral chip itself, a higher frequency clock signal from that lower frequency system clock. A number of current microprocessors and peripheral chips implement such a technique-for example, the 80486DX2 by Intel Corporation. This technique has the advantage of increasing a chip's internal processing rate without requiring a corresponding increase in system clock frequency, thus avoiding the problems associated with those higher clock rates.

To generate these higher frequency internal clock signals, these chips typically use a phase-locked loop (PLL) configured as a frequency multiplier. A block diagram of such a frequency multiplier circuit is shown in FIG. 1. As is shown, a phase detector (or phase comparator) drives, through a low-pass filter, a voltage controlled oscillator (VCO). The output of that voltage controlled oscillator, which becomes the output signal, is then divided by the desired multiplication factor. The phase detector then compares that divided reference signal with the input signal. This feedback arrangement compensates for shifts in the phase and frequency of the input signal by a level shift to the voltage controlled oscillator, and the output signal is thus synchronized to the input signal. Examples of PLLs that can be configured as frequency multipliers include the CD4046A by RCA Corporation and the 74LS297.

The phase detector has two main purposes. First, it forces the voltage controlled oscillator to shift frequencies when the reference signal and the input signal are of different frequencies. Second, using feedback it forces slight corrections to the voltage controlled oscillator output when the reference and input signals are of the same frequency but are slightly out of phase. Both of these functions are accomplished by adjusting the frequency of the voltage controlled oscillator; it is simply a difference of the magnitude of the adjustment.

Before an input frequency is provided to the phase detector shown in FIG. 1, the voltage controlled oscillator runs at a certain "free running" frequency. This can be higher or lower than the subsequent locked-in frequency, but is typically higher in PLLs as used in microcomputers. The frequency of the output signal of the voltage controlled oscillator is proportional to the voltage across the filtering capacitor. When "free running," the filtering capacitor will be at its maximum voltage, which in turn causes the voltage controlled oscillator to run at its maximum frequency.

To provide an output frequency which is a multiple of the input frequency, a divider stage divides the voltage controlled oscillator output signal before providing it to the phase detector. The divider stage is typically constructed from a flip-flop or stages of flip-flops. To divide by 2, a single flip-flop halves the voltage controlled oscillator output; to divide by 4, two flip-flops are staged. Of course, frequency dividers are well-known in the art, and one can divide by factors other than multiples of 2 using appropriate combinations of flip-flops or counters.

As can be seen in FIG. 1, the divider stage is driven by the output of the voltage controlled oscillator. The flip-flops and counters in the divider stage, however, typically have a maximum input frequency at which they can reliably track. This necessitates a trade off between speed and cost; the faster the flip-flops, and thus the higher the maximum speed of the PLL, the greater the cost. A maximum free running frequency of 300 MHz is easily achievable for the voltage controlled oscillator stage, but flip-flops for the divider stage capable of running at 300 MHz can be expensive to construct in integrated circuits. The same problem exists in a non-multiplying PLL. The phase-detector in such a PLL is fed directly from the voltage controlled oscillator, and that signal may exceed the capabilities of the input buffers of the phase detector.

Therefore, it is desirable to construct PLLs using lower speed flip-flops in the divider stage. Similarly, it is also desirable to construct PLLs using phase detectors with lower speed input buffers. However, problems may develop in those cases as the free running frequency of the voltage controlled oscillator may cause indeterminate states or erratic operation of the flip-flops and phase detector. This problem could then lead to recurring errors so that the PLL is never able to lock in on the desired frequency, even after an input signal is provided. Therefore, it is desirable to be able to use the lower frequency flip-flops and phase detectors and yet not have this lock failure problem.

SUMMARY OF THE INVENTION

The method of and apparatus for constructing PLL circuits utilizing lower frequency, and thus less expensive, flip-flops utilizes circuitry that prevents the voltage controlled oscillator from running at a free running frequency above a certain specified threshold. Specifically, a Zener diode is provided in parallel to the capacitor in the low pass filter, thus limiting the input voltage to the voltage controlled oscillator. Knowing the voltage into the voltage controlled oscillator that yields its maximum free running frequency, that voltage is then limited by using a Zener diode with a breakdown voltage proportionally less than that maximum voltage. The voltage controlled oscillator free running frequency is then limited in the same proportion, and thus lower frequency flip-flops in the divider stage or inputs to the phase detector can be used, thus limiting costs.

BRIEF DESCRIPTION OF THE DRAWINGS

A better understanding of the present invention may be obtained when the detailed description of the preferred embodiment is considered in conjunction with the following drawings, in which.

DETAILED DESCRIPTION OF THE PREFERRED EMBODIMENT

Figure 2:
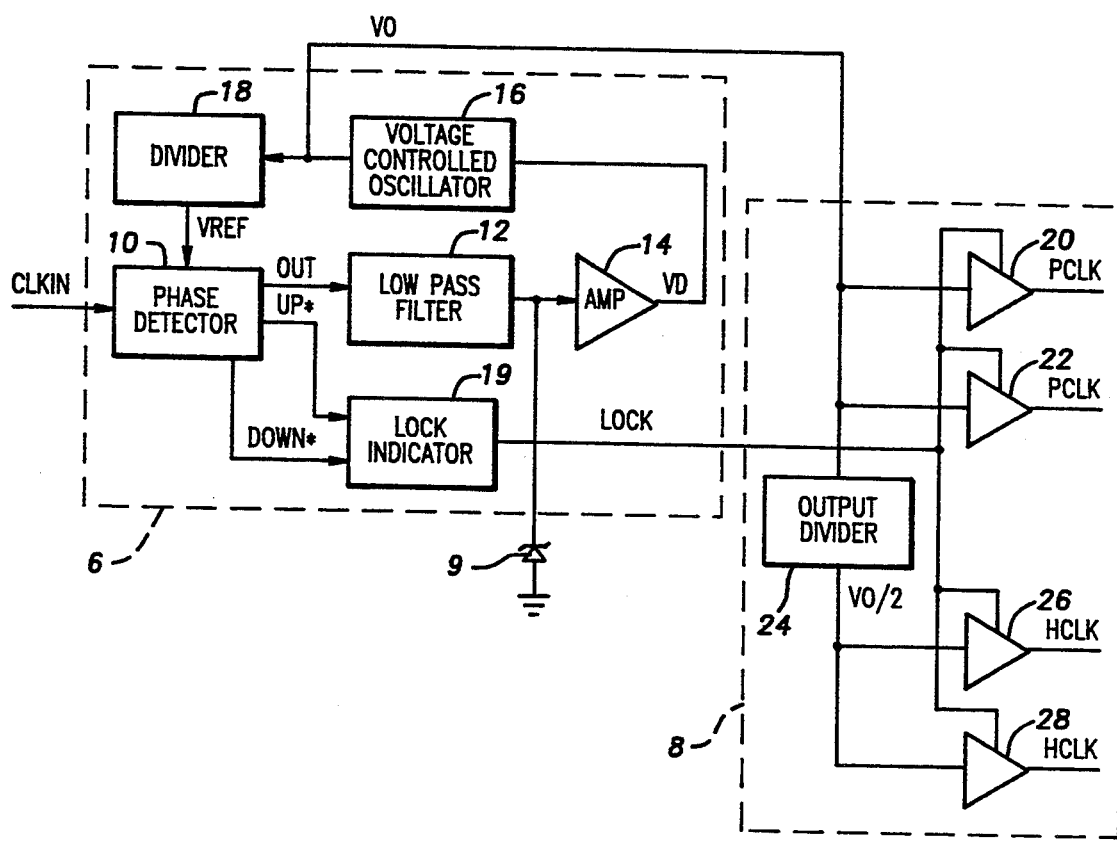
FIG. 2 is a block diagram showing the elements of a phase-locked loop based clock generation circuit along with a Zener diode to limit the voltage controlled oscillator free running frequency.

Turning to the drawings, FIG. 2 shows a block diagram of the circuit elements of an integrated circuit constructed according to the invention. The diagram in FIG. 2 shows PLL circuitry 6, output circuitry 8, and a Zener diode 9.

As an input, the signal CLKIN is provided as a master clock signal. The frequency of CLKIN is of course arbitrary, but in this embodiment is 16.5 MHz. CLKIN will typically be a square wave, but could be any periodic signal that can drive a PLL, such as a sine wave. A sine wave would typically be first passed through a buffer to convert it into a square wave.

The signal CLKIN is provided to a phase detector 10. The phase detector 10 can be constructed in a variety of ways; the circuit used in this embodiment is described later in the discussion of FIG. 5. In this embodiment, the phase detector 10 provides two signals, UP*, and DOWN*,. The signals UP, and DOWN, are filtered through a low pass filter 12, and then driven into an amplifier 14. The feedback circuitry 9 provides an output also connected to the input of the amplifier 14 in a summing arrangement. The amplifier 14 provides a control voltage VD to a voltage controlled oscillator (VCO) 16, which generates a square wave signal VO. VO is then divided by a divider 18. The divider 18 can conceivably divide VO by any integral value, but in this embodiment divides the signal VO by four. This divided signal then becomes the reference signal VREF, which is fed back as a reference input signal into the phase detector 10.

In operation, the phase detector 10, low pass filter 12, amplifier 14, voltage controlled oscillator 16, and divider 18 form a PLL configured for frequency multiplication. When the PLL is locked, the output signal VO is in phase with CLKIN, and is an integral multiple of the frequency of CLKIN. In this embodiment VO is a 66 MHz square wave, as CLKIN is a 16.5 MHz signal.

Also associated with the PLL circuitry 6 is a lock indicator 19. The lock indicator 19 is driven by the UP* and DOWN* signals from the phase detector 10, and is described later in the discussion of FIG. 4. When the lock indicator 19 determines that the phase detector 10 indicates that the PLL circuitry 6 is locked onto CLKIN, the lock indicator 19 delays for an arbitrary amount of time and then asserts an active high lock indication signal LOCK. This delay ensures that the PLL circuitry 6 has locked in on CLKIN, that CLKIN is stable, and that the PLL circuitry is stable. When the lock indicator 19 asserts LOCK true, or high, the output circuitry 8 becomes active. At all times, VO drives the inputs of high frequency output buffers 20 and 22. The high frequency output buffers 20 and 22 are tri-state buffers and are disabled and enabled by the signal LOCK. When LOCK is asserted high, the high frequency output buffers 20 and 22 are switched from a tri-state condition to an enabled condition. The high frequency output buffers 20 and 22 are then driving the signal VO as their output signal PCLK or processor clock. Of course, as few or as many output buffers as desired can be added to this design.

The signal VO/2 is generated by dividing the signal VO by the output divider 24. This signal is fed to low frequency output buffers 26 and 28, which are also tri-state buffers and provide the HCLK, or host bus clock signal. These buffers 26 and 28 are enabled and disabled by LOCK in the same way as the high frequency output buffers 20 and 22.

The signal VO is divided by the divider 18, which in this embodiment divides by four. The divider 18 is typically constructed using staged flip-flops, and typically has some maximum input frequency. As previously discussed, the higher the maximum input frequency of the output divider 18, the greater the expense. Thus, to reduce costs, the maximum input frequency of the divider 18 is kept as low as possible. As will be seen, this is achieved through use of the Zener diode 9.

Figure 1:
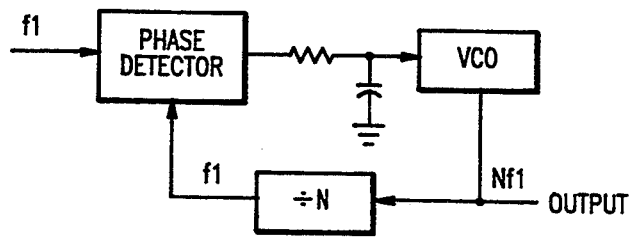
FIG. 1 is a prior art block diagram of a phase-locked loop configured as a frequency multiplier.

The Zener diode 9 is connected between the output of the low pass filter 12 and ground. The low pass filter 12 in this embodiment is a series resistor followed by a capacitor to ground, as shown in the prior art FIG. 1. In this embodiment, the low pass filter 12 typically has an output of between 0 and 5 volts. This is supplied as an input to the amplifier 14, which drives the same voltage into the voltage controlled oscillator 16. In this embodiment, the voltage controlled oscillator 16 has an output frequency between 0 and 300 MHz corresponding to the 0 to 5 volt signal driven by the amplifier 14 to the voltage controlled oscillator 16.

The divider 18, however, does not allow for such an input frequency range. In this embodiment, the flip-flops and the divider 18 are chosen to have a maximum input frequency of just slightly greater than 150 MHz. Thus, the voltage controlled oscillator 16 must have an output limited to 150 MHz, rather than its 300 MHz natural free running frequency. This would correspond to a voltage into the voltage controlled oscillator 16 of approximately 2.5 volts, thus limiting the output frequency of the voltage controlled oscillator 16 to 150 MHz ((300 MHz/5 volts)·2.5 volts).

To limit the voltage to 2.50 volts, and thus the voltage controlled oscillator 16 frequency to 150 MHz, the Zener diode 9 is provided with a breakdown voltage of 2.5 volts. Of course, the breakdown voltage of the Zener diode 9 can be adjusted depending on the speed of the flip-flops in the divider and the desired output frequency.

If the voltage controlled oscillator 16 output frequency were not limited by the Zener diode 9, the divider 18 could not accurately track the output of the voltage controlled oscillator 16. As a result, the divider 18 would not provide an accurate signal to the phase detector 10, and the phase detector would never indicate a lock through the lock indicator 19. Thus, the PLL circuitry 6 would never go into lock, and the output VO would never drop to its lock-in frequency at 66 MHz. Further, the outputs of buffers 20, 22, 26 and 28 would never be activated and output clock signals would never be provided, thus resulting in a non-functioning computer system.

Of course the Zener diode 9 need not be provided in front of the amplifier 14. It can instead be placed between the amplifier 14 and the voltage controlled oscillator 16. One would then use a current limiting resistor between the amplifier 14 and the Zener diode 9, but the principal remains the same; the Zener diode 9 limits the input voltage to the voltage controlled oscillator 16, thus limiting the frequency of the signal output from the voltage controlled oscillator 16.

Digital Phase Detector

Figure 3:
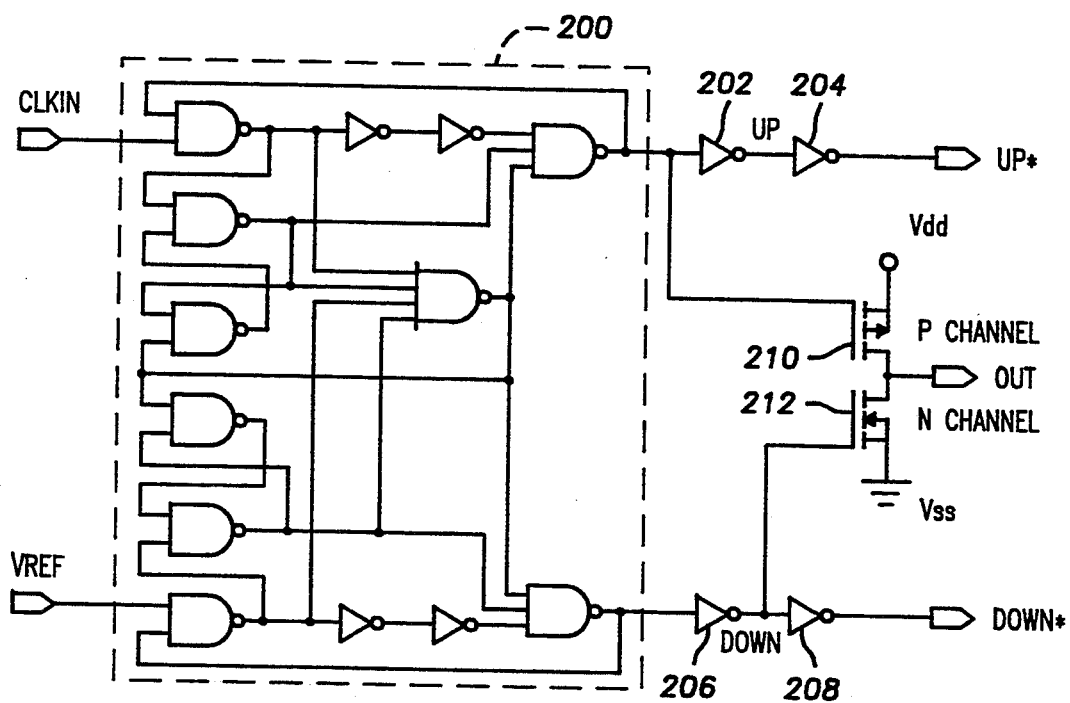
FIG. 3 is a schematic of a typical digital phase detector used in a circuit built according to the block diagram in FIG. 2.

FIG. 3 shows a schematic for the phase detector 10 as used in this embodiment. A variety of circuits could be used, but the particular circuit shown in FIG. 5 has the advantages of not being dependent upon the duty cycles of CLKIN and VREF, and the advantage of providing for a very small phase shift between CLKIN and VREF. In the circuit of FIG. 3, CLKIN and VREF are provided as input signals to digital phase detection circuitry 200, which provides, through inverters 202, 204, 206 and 208, the output signals UP* and DOWN*. When the frequency of CLKIN is greater than the frequency of VREF, UP, goes continuously low, or true. Conversely, when the frequency of CLKIN is less than the frequency of VREF, DOWN, goes continuously low, or true. If the frequencies of CLKIN and VREF are the same, but CLKIN lags VREF, then DOWN, is maintained low for a time corresponding to the phase difference. Conversely, if CLKIN leads VREF, then UP* is maintained low for a period corresponding to the phase difference.

An OUT signal is used to drive the low pass filter 12. OUT can be generated by a push-pull pair of MOSFETs. The gate of a p-channel MOSFET 210 is driven by the UP* signal, while its source is connected to Vdd. The gate of an n-channel MOSFET 212 is driven by the DOWN signal, while its source is connected to ground. The drains of both MOSFETS 210 and 212 are tied together, and provide the signal OUT. When UP* goes low, a p-channel MOSFET 210 turns on, driving OUT to Vdd. When DOWN goes high, the n-channel MOSFET 212 turns on, driving OUT to ground. When neither UP nor DOWN is true, OUT is in a high impedance state. Other circuits could be used to convert the two DOWN* and UP* signals to the single OUT signal. OUT is filtered through the low-pass filter 12 and the resulting filtered signal driven into the amplifier 14. The amplified signal then adjusts the voltage controlled oscillator 16 to maintain VREF and CLKIN at the same frequency and phase.

As can be seen from FIG. 3, the phase detector 10 uses NAND gates as its inputs. These NAND gates, like flip-flops, have a limited input frequency. If the divider 18 is omitted, the PLL circuitry 6 becomes a non-multiplying PLL, and the digital phase detection circuitry 200 then places its own limitations on the possible voltage controlled oscillator 16 output frequency. Thus, the Zener diode 9 would again prove useful in limiting the output of the voltage controlled oscillator 16 to a frequency that the digital phase detection circuit 200 (or whatever circuitry is used for the phase detector 10) is capable of handling.

Lock Indicator

Figure 4:
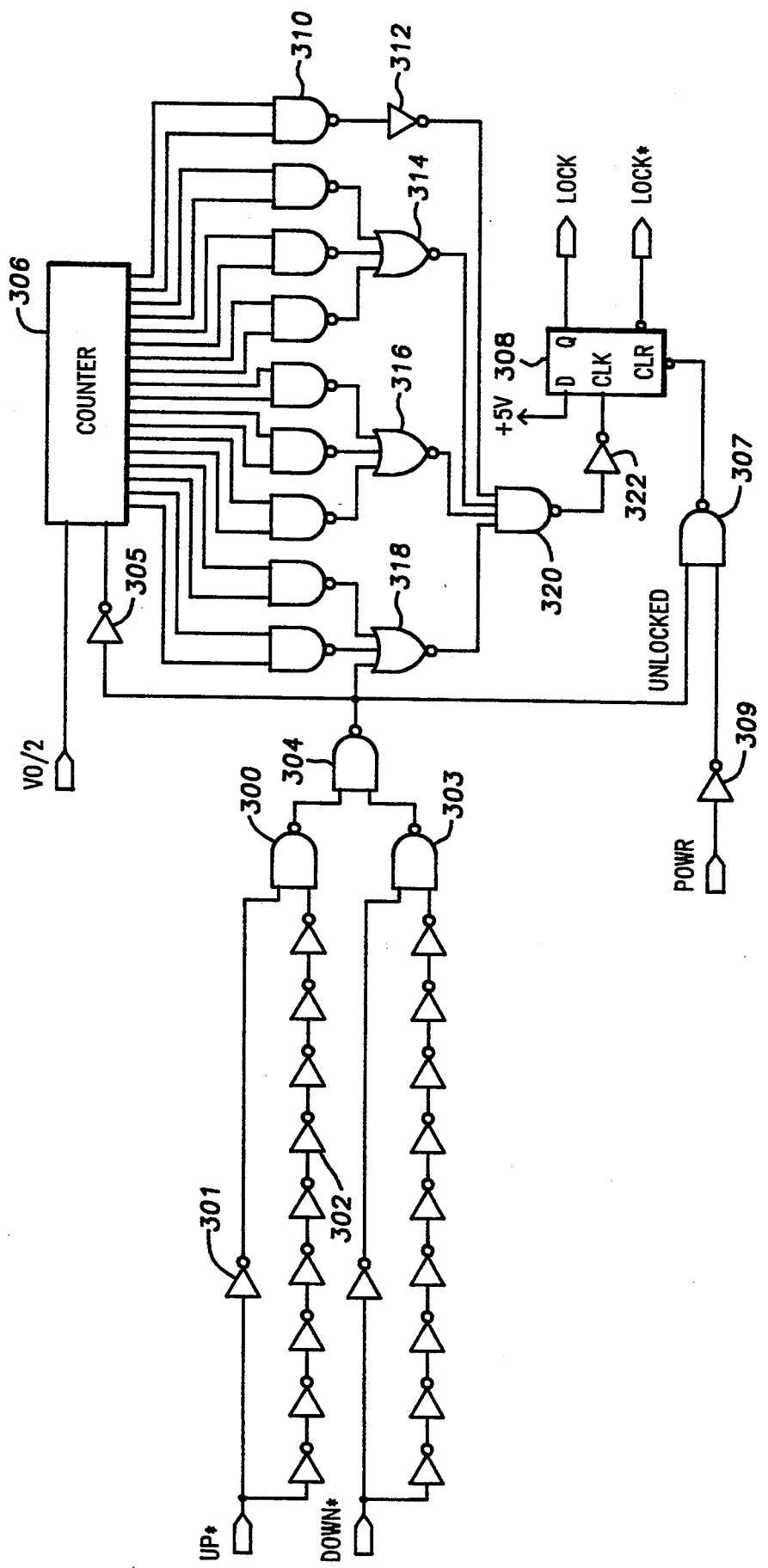
FIG. 4 is a schematic of a typical delay circuit used in the lock indicator of a circuit built according to the block diagram in FIG. 2.

FIG. 4 shows a schematic of the circuitry used to implement the lock indicator 19. As inputs, FIG. 4 uses the signals UP* and DOWN, provided by the phase detector 10, as shown in FIG. 3. When UP* goes low, or true, a high signal goes to one input of a NAND gate 300 via an inverter 301 and the active low UP* signal also goes through a series of inverters 302. The series of inverters 302 functions as a delay line to the NAND gate 300 so that very narrow UP, signal pulses are filtered. These pulses are those generated by the phase detector 10 in normal operation to adjust for slight drifts in the phase of VREF. Thus, only when UP*, goes low for a period of time long enough for that low signal to traverse the series of inverters 302 will the output of the NAND gate 300 go low, or true. The DOWN* signal uses corresponding circuitry. When the output of the NAND gate 300 goes low, that indicates that the PLL is no longer in lock. So, the output of a second NAND gate 304, which receives the outputs of the NAND gate 300 and the corresponding NAND gate 303 in the DOWN* circuitry, correspondingly goes high. The output of the NAND gate 304 is the UNLOCKED signal, which is provided to an inverter 305 and one input of a NAND gate 307. The inverter 305 has its output connected to the inverted clear input of a counter 306. The second input of the NAND gate 307 is connected to the output of an inverter 309, which receives the POWR or power-on reset signal at its input. This signal stays high until Vdd rises to an arbitrary voltage level, here being 2.0 volts. The output of the NAND gate 307 is connected to the inverted clear input of a flip-flop 308. So when the output of NAND gate 304 is high, the counter 306 is cleared and the flip-flop 308 is cleared after the reset period.

When UP* and DOWN* are once again both high, and thus the PLL is locked, then the NAND gate 304 output is low, and the counter 306 begins counting. The clock for the counter 306 is VO/2, which runs at 33 MHz. The counter 306 has 18 stages going into a series of 9 two input NAND gates 310. When all 18 lines of the counter 306 are true, the series of NAND gates 310 outputs are all low. The output of one NAND gate 310 is inverted by an inverter 312 and provided as one input to a NAND gate 320. The outputs of three NAND gates 310 are provided to the inputs of a NOR gate 314, whose output is connected to the NAND gate 320. The outputs of three more NAND gates 310 are provided to the inputs of a NOR gate 316, whose output is also connected to NAND gate 320. The final two NAND gates 310 are connected to inputs of a NOR gate 318. The third input of the NOR gate 318 receives the UNLOCKED signal from the NAND gate 304. The output of the NOR gate 318 is the final input to the NAND gate 320. The output of the NAND gate 320 is inverted by an inverter 322, whose output is connected to the clock input of the flip-flop 308. The D input of the flip-flop 308 is connected to a logic high level. The non-inverted and inverted outputs of the flip-flop 308 are the LOCK and LOCK* signals, respectively.

As the counter 306 counts up and all the outputs are true and the PLL is still locked, the flip-flop 308 is clocked and the LOCK signal goes true. If lock is lost for greater than a minimal period, then the counter 306 and the flip-flop 308 are cleared and the LOCK signal goes false. The counter 306 thus provides a lock delay period of approximately 10 milliseconds.

A failure to limit the output frequency of the voltage controlled oscillator 16 can result in the lock indicator 19 never indicating a lock, as the PLL circuitry 6 will never enter a locked state because the divider 18 or the phase detector 10 cannot not successfully track the output of the voltage controlled oscillator 16. Thus, Zener diode 9 again shows its usefulness, as it permits the PLL circuitry 6 to work properly even when lower speed flip-flops are used in the divider 18 or the phase detector 10.

DETAILS OF THE PREFERRED EMBODIMENTS

Figure 5:
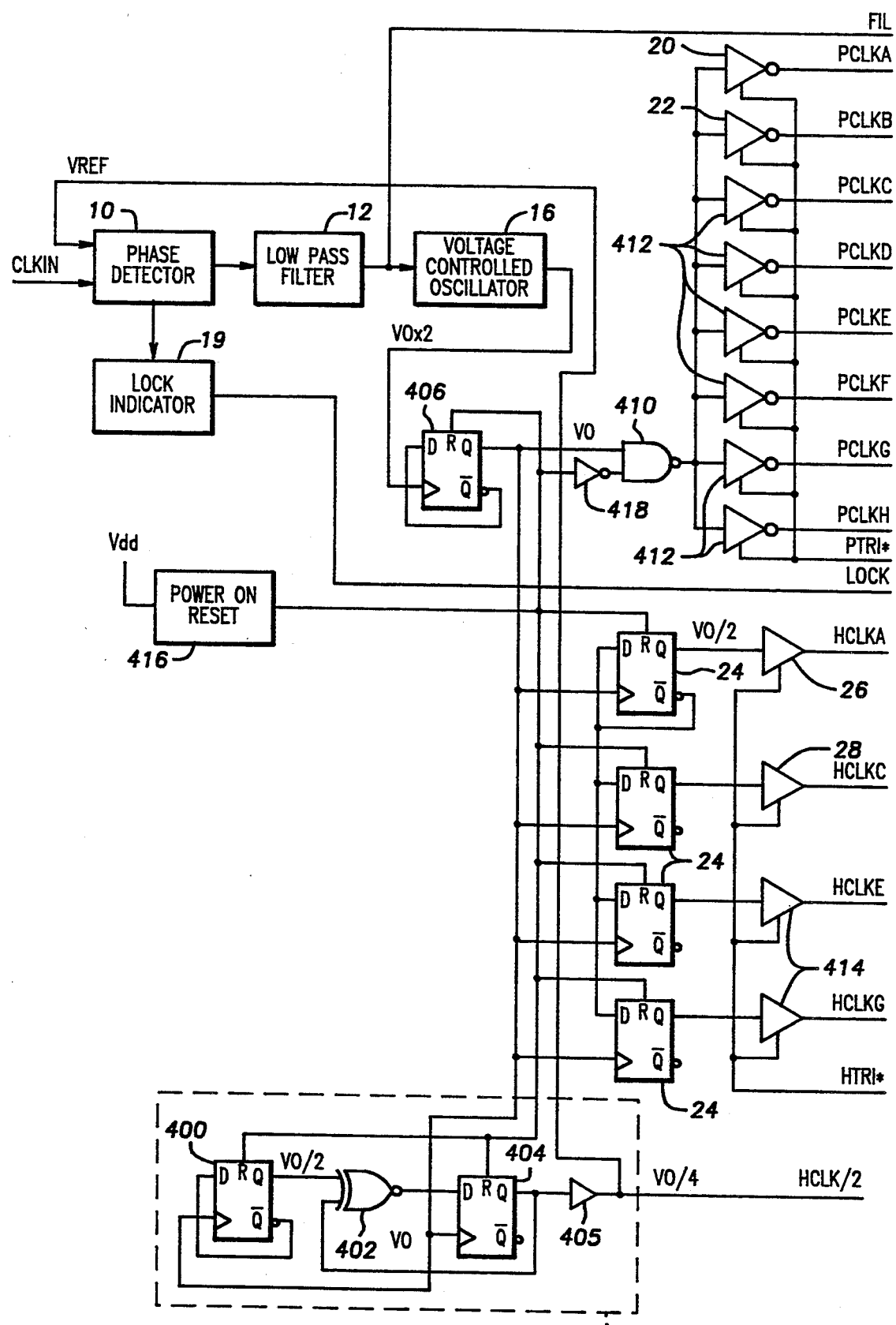
FIG. 5 is a combination schematic and block diagram of a multiplying PLL and clocking integrated circuit constructed for use according to the invention.

FIG. 5 shows a schematic of portions of the internal circuitry of an integrated circuit actually implemented according to the invention. Shown are the phase detector 10, the low-pass filter 12, the voltage controlled oscillator 16, the divider 18, the lock indicator 19, and the output divider 24.

Also shown are the high frequency output buffers 20 and 22 and the low frequency output buffers 26 and 28. The enables for the high frequency output buffers 20 and 22 are driven by the signal PTRI*. Similarly, the enables for the low frequency output buffers 26 and 28 are driven by the signal HTRI*. These inputs are active high in the sense that the outputs are enabled when PTRI* and HTRI, are high and tri-stated when the signals PTRI, and HTRI* are low.

The divider 18 is shown, being made up of a first D flip-flop 400, an inverting output XOR gate 402, a second D flip-flop 404, and a driver 405. The first D flip-flop 400 has as its clock input the signal VO. The inverting output of the first D flip-flop 400 is tied to its D input. Thus, the signal out of the first D flip-flop 400 is VO/2. The non-inverting output of the first D flip-flop 400 is connected to one input of the inverting output XOR gate 402. The other input is connected to the non-inverting output of the second D flip-flop 404. The output of the inverting output XOR gate 402 is connected to the D input of the second D flip-flop 404. The non-inverting output of the second D flip-flop 404 is also connected to a driver 405. The output of the driver 405 is the signal VO/4 and becomes the reference input VREF of the phase detector 10.

In FIG. 5, an additional divider 406 is provided between the output of the voltage controlled oscillator 16 and the line carrying the signal VO. Thus, for VO to be a 66 MHz signal, for example, the voltage controlled oscillator 16 must generate VO times two, which is a 132 MHz signal. Thus, the divider 406 must handle at least a 132 MHz input signal when in lock; it must handle even higher frequencies when the voltage controlled oscillator 16 is free running. If the voltage controlled oscillator 16 were permitted to run at its full free running frequency of 300 MHz, the flip-flops that make up the divider 406 would have to be able to track a frequency of 300 MHz. Because the Zener diode 9 is externally connected to the FIL line, however, limiting the DC input voltage to the voltage controlled oscillator 16 to 2.5 volts, the divider 406 need only be able to track an input frequency of 150 MHz, or half of the voltage controlled oscillator 16 unrestricted free running frequency. This, of course, reduces the cost associated with the flip-flops that makes up the divider 406. Of course the other flip-flops used in constructing the circuitry of FIG. 5 will correspondingly need track only reduced frequencies. In fact, as the free running frequency of 300 MHz of the voltage controlled oscillator 16 has been now limited to 150 MHz, all of the flip-flops and the circuitry of FIG. 5 need only handle half of their previous maximum input frequencies.

The output of the additional divider 406 then becomes the signal VO and drives the high frequency output buffers 20 and 22, as well as additional high frequency buffers 412, through a NAND gate 410. The output of the additional divider 406 also drives the low frequency output buffers 26 and 28, as well as additional low frequency buffers 414, through the output divider 24, which here is a series of D flip-flops, one for each output. The output of the additional divider 406 drives the clock of each flip-flop making up the output divider 24. One inverting output of this series of D flip-flops making up the output divider 24 is tied to the D input of each flip-flop. The non-inverting outputs then are connected to the low frequency output buffers 26 and 28, as well as additional low frequency buffers 14.

Power-on reset circuitry 416 detects when Vdd goes on, and then drives an active high RESET signal to the reset input of the additional divider 406, an input of the NAND gate 410 through an inverter 418, the reset input of each D flip-flop making up the output divider 24, and the reset inputs of the first D flip-flop 400 and the second D flip-flop 404 in the divider 18. Finally, the lock indicator 19 provides the active high lock indication signal LOCK.

Figure 6:
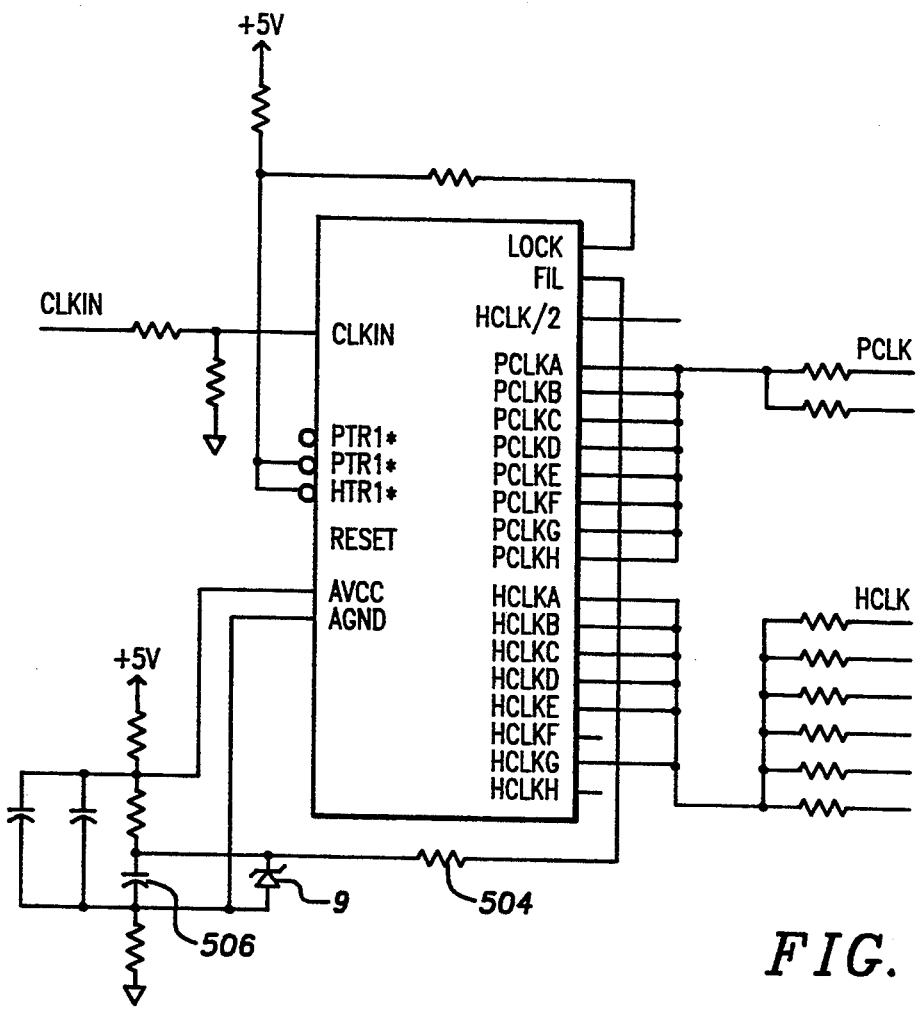
FIG. 6 is a schematic showing typical external circuitry used to drive the integrated circuit of FIG. 5, including circuitry to limit the voltage controlled oscillator free running frequency according to the invention.

An integrated circuit constructed according to the invention as illustrated in the schematic of FIG. 5 is configured as shown in FIG. 6 when used in a digital computer system. Specifically, CLKIN is a 16.5 MHz system clock. The LOCK output feeds into the PTRI* and HTRI* inputs of the chip. When LOCK goes high, PTRI* is driven high, which enables the high frequency output buffers 20 and 22. Similarly, HTRI, is also asserted high, enabling the low frequency output buffers 26 and 28.

Finally, the FIL line, which is part of the low-pass filter 12, goes into a capacitor 506. This capacitor 506 connects to the FIL line through a resistor 504, which is a small current limiting resistor, and the capacitor 506 forms the tail-end of the low pass filter 12. This assists in converting the digital OUT signal output by the phase detector 10 to an analog signal suitable for input to the voltage controlled oscillator 16. Further, the capacitor 506 connects in parallel to the Zener diode 9, which limits the input voltage to the voltage controlled oscillator 16 to 2.5 volts.

Figure 7:
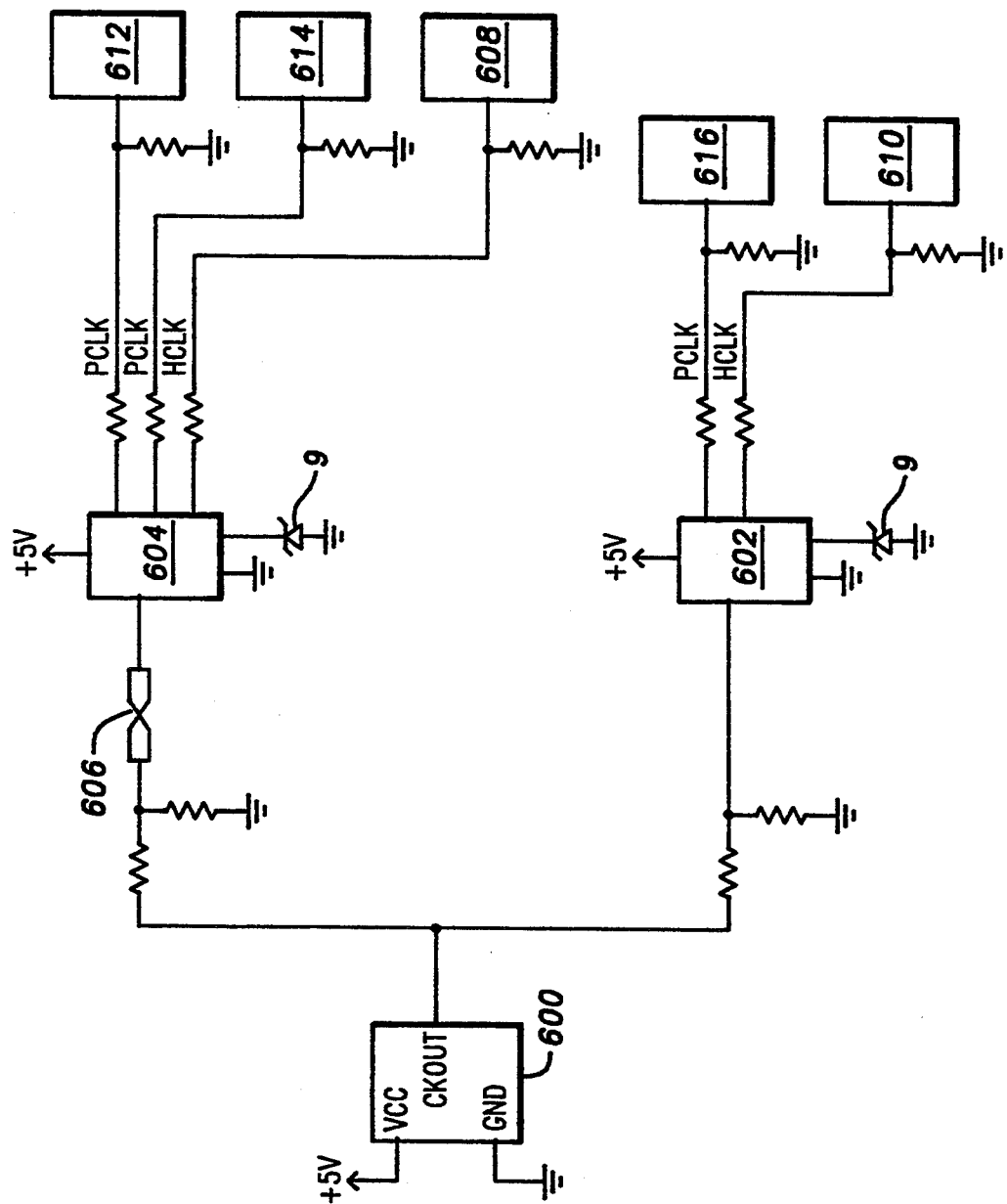
FIG. 7 is a schematic and block diagram showing a number of integrated circuits as shown in FIG. 5 used in a system to generate high frequency local clock signals from a lower frequency master clock signal, with the voltage controlled oscillator free running frequencies limited according to the invention.

Finally, FIG. 7 shows how the integrated circuit constructed according to the invention as shown in FIG. 5 is used in a system. A master clock circuit 600 generates the 16.5 MHz system clock CLKIN. This clock is distributed to both an onboard clock generator chip 602 and an offboard clock generator chip 604, these chips being constructed according to the schematic and block diagram of FIG. 5. The offboard clock generator chip 604 is located on a separate board connected to the main system board by a connector 606.

The onboard clock generator chip 602 and the offboard clock generator chip 604 generate a 66 MHz clock signal PCLK and a 33 MHz clock signal HCLK. These signals are local clock signals for use by peripheral chips 608, 610, 612, 614 and 616. The generator chips 602 and 604 can be repeated as desired to provide local clock signals to other peripheral chips. Of course, according to the invention, these signals are tri-stated until the PLLs on the onboard clock generator chip 602 and the offboard clock generator chip 604 stabilize. FIG. 7 shows PCLK as being provided to peripheral chips 608 and 610, while HCLK is provided to peripheral chips 612, 614 and 616. Of course, the number of chips which require each frequency is arbitrary, and in fact one chip could receive both frequencies of clock signal. Each clock generator chip 602 and 604 has associated with it a feedback circuit 9 to allow correction of edge placement errors present in the clock generator chips 602 and 604.

The offboard clock generator chip 604 and onboard clock generator chip 602 are typically located physically near the chips that use their local clock signals. This prevents transmission line problems associated with transmitting high frequency clock signals over long traces. In a typical system, chips using the 66 MHz signal would include, for example, the 66 MHz P5 or Pentium microprocessor from Intel Corporation. By delaying the provision of the PCLK and HCLK signals to these devices until the PLL in the clock generator chip 604 is stable, the devices do not receive a clock signal that is out of specification or rapidly changing.

Further, the Zener diodes 9 and 9' limit the free running frequencies of the PLLs in the offboard clock generator chip 604 and onboard clock generator chip 602. Typically, the Zener diodes 9 and 9' have a breakdown voltage of 2.4 volts, which limits the free running frequency to slightly less than 150 MHz. Thus, by using 150 MHz maximum input frequency flip-flops, the cost of the offboard clock generator chip 604 and onboard clock generator chip 602 is reduced, as they require less expensive flip-flops in their divider stages.

This invention has been described in terms of particular embodiments. Obviously, modifications and alterations will be apparent to those skilled in the art in view of this disclosure. It is therefore intended that all such equipments, modifications, and variations fall within the spirit and scope of the invention as claimed.

I claim:

1. A method of limiting a free running output frequency of a voltage controlled oscillator in a phase-locked loop circuit, said phase-locked loop circuit containing a low pass filter, a voltage controlled oscillator and a phase detector, wherein said free running output frequency of said voltage controlled oscillator is limited to a frequency which does not exceed a maximum input frequency of said phase detector, comprising the steps of:

receiving an output voltage from said low pass filter in said phase-locked loop circuit;

developing a limited voltage signal in response to said output voltage by applying said output voltage across a zener diode connected to ground, said limited voltage signal being less than a maximum input voltage of said voltage controlled oscillator in said phase-locked loop circuit; and providing said limited voltage signal to an input of said voltage controlled oscillator in said phase-locked loop circuit such that said free running output frequency does not exceed a maximum input frequency of a flip-flop circuit in said phase-locked loop circuit that uses a signal output from said voltage controlled oscillator.

2. The method of claim 1, wherein said limited voltage signal is provided to said input of said voltage controlled oscillator through an amplifier.

3. A phase-locked loop circuit that limits a free running output frequency of a voltage controlled oscillator in said phase-locked loop circuit to a frequency which does not exceed a maximum input frequency of a flip-flop circuit in said phase-locked loop circuit that uses a signal output from said voltage controlled oscillator, said phase-locked loop circuit comprising:

a voltage controlled oscillator having an input with a maximum input voltage corresponding to a maximum free running output frequency;

a flip-flop circuit driven by an output of said voltage controlled oscillator, said flip-flop circuit having a maximum input frequency; and a zener diode connected to ground and coupled to said input of said voltage controlled oscillator, said zener diode limiting a voltage to said input of said voltage controlled oscillator to a voltage not exceeding said maximum input voltage, such that an output frequency of said voltage controlled oscillator is less then said maximum free running output frequency, and such that said output frequency of said voltage controlled oscillator is below said maximum input frequency of said flip-flop circuit.

4. The circuit of claim 3, further comprising:

a phase detector receiving a reference frequency signal and a signal proportional to said output frequency of said voltage controlled oscillator and having an output providing an output signal indicative of both frequency and phase difference between said received signals;

a low pass filter coupled between said output of said phase detector and said input of said voltage controlled oscillator, said low pass filter including a capacitor; and wherein said zener diode is connected between said capacitor of said low pass filter and ground.

5. The circuit of claim 4, further comprising:

an amplifier connected between said low pass filter and said input of said voltage controlled oscillator.

6. The circuit of claim 4, further comprising:

a divider stage receiving as an input said output of said voltage controlled oscillator and providing said output signal proportional to said output of said voltage controlled oscillator, said divider stage including a plurality of flip-flop circuits, wherein said flip-flop circuit is one of said included plurality of flip-flop circuits.

* * * * *

UNITED STATES PATENT AND TRADEMARK OFFICE
CERTIFICATE OF CORRECTION

PATENT NO. : 5,389,897
DATED : February 14, 1995
INVENTOR(S) : Ghassan R. Gebara It is certified that error appears in the above-identified patent and that said Letters Patent is hereby corrected as shown below:

Column 10,
Line 36, delete "then" and insert therefor -- than --

Signed and Sealed this

Twenty-sixth Day of July, 2005

JON W. DUDAS
*Director of the United States Patent and Trademark Office*